United States Patent [19]

May

[11] Patent Number: 5,023,483

[45] Date of Patent: Jun. 11, 1991

[54] APPARATUS AND METHOD FOR DECODING FOUR STATES WITH ONE PIN

[75] Inventor: Bradley A. May, San Jose, Calif.

[73] Assignee: Chips and Technologies, Incorporated, San Jose, Calif.

[21] Appl. No.: 372,070

[22] Filed: Jun. 27, 1989

[51] Int. Cl.$^5$ ...................... H03K 19/02; H03K 17/16
[52] U.S. Cl. ................................... 307/463; 307/449; 307/243; 307/272.2; 307/518
[58] Field of Search ............... 307/443, 449, 463, 243, 307/272.2, 518

[56] References Cited

U.S. PATENT DOCUMENTS

| | | | |
|---|---|---|---|
| 4,306,163 | 12/1981 | Blume, Jr. et al. | 307/449 |
| 4,645,944 | 2/1987 | Uya | 307/243 |
| 4,661,802 | 4/1987 | Yukawa | 307/243 |
| 4,721,868 | 1/1988 | Cornell et al. | 307/243 |
| 4,835,414 | 5/1989 | Freidin | 307/243 |
| 4,910,417 | 5/1990 | El Ganal et al. | 307/243 |
| 4,910,466 | 3/1990 | Kiuchi et al. | 307/463 |

FOREIGN PATENT DOCUMENTS 0966903  10/1982  U.S.S.R. .................. 307/243

Primary Examiner—Stanley D. Miller
Assistant Examiner—Margaret Rose Wambach
Attorney, Agent, or Firm—Townsend and Townsend

[57] ABSTRACT

According to one aspect of the invention, a novel control circuit is coupled to a pin at a circuit node. The circuit node has a particular default condition of one of two logic states. The control circuit stores the default value and subsequently attempts to drive an alternate logic state onto the pin. The circuit then reads the logic state at the pin to determine if there has been a change of logic state registered. If a change has been registered, then the existence of a third condition or fourth condition is indicated, depending upon the default logic state.

10 Claims, 3 Drawing Sheets

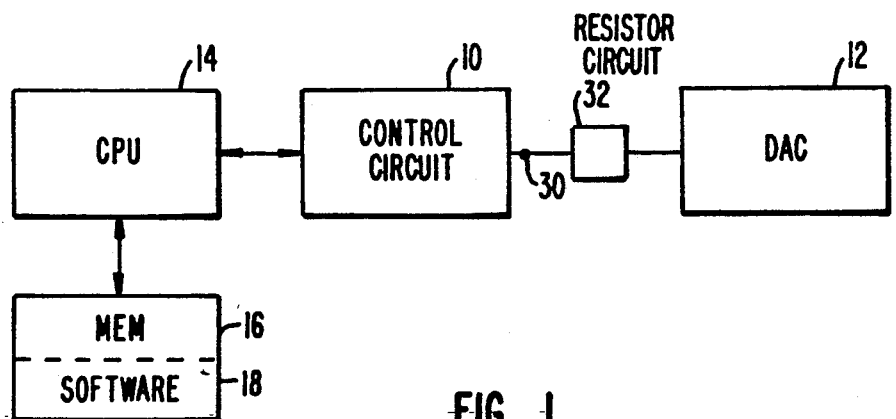
FIG._1.
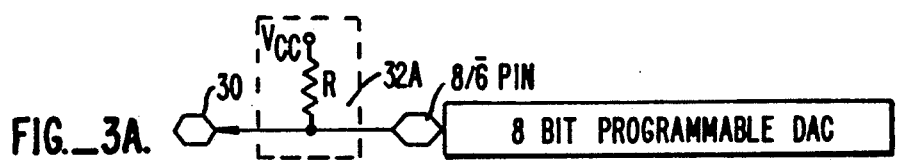
FIG._3A.
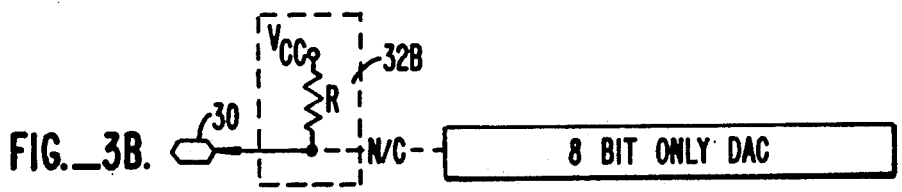
FIG._3B.
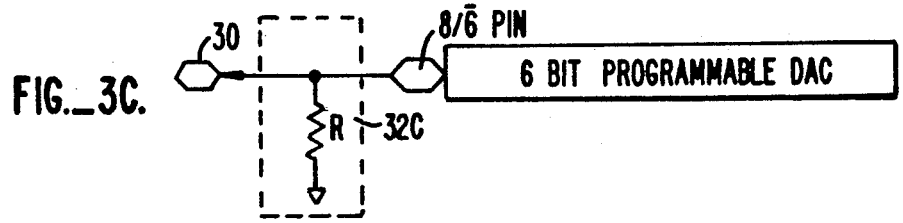
FIG._3C.
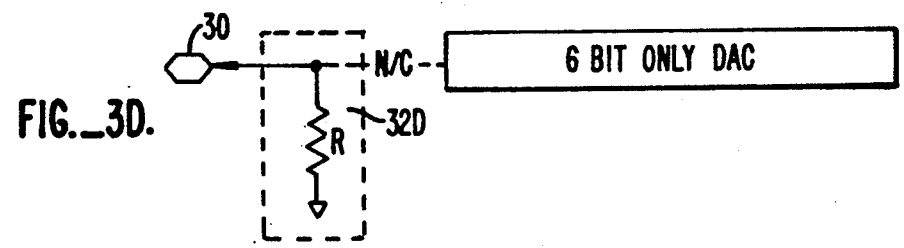
FIG._3D.
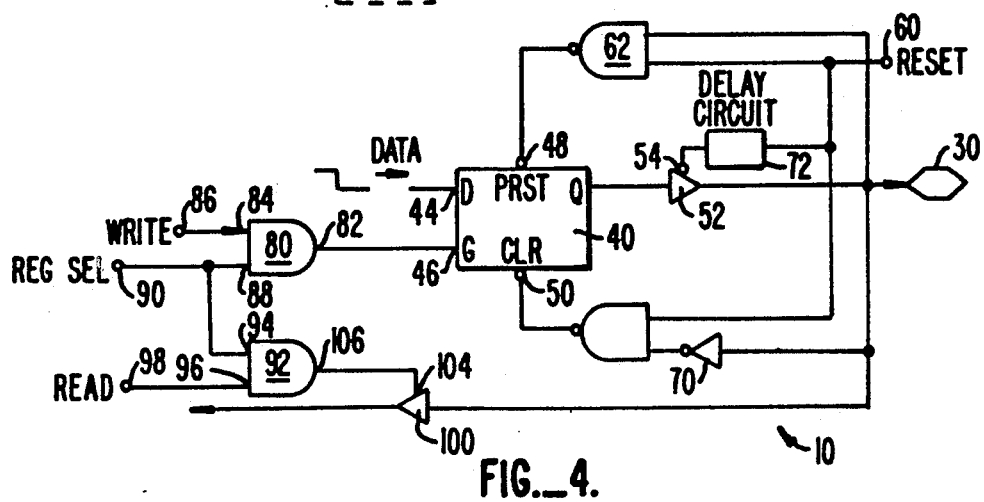
FIG._4.

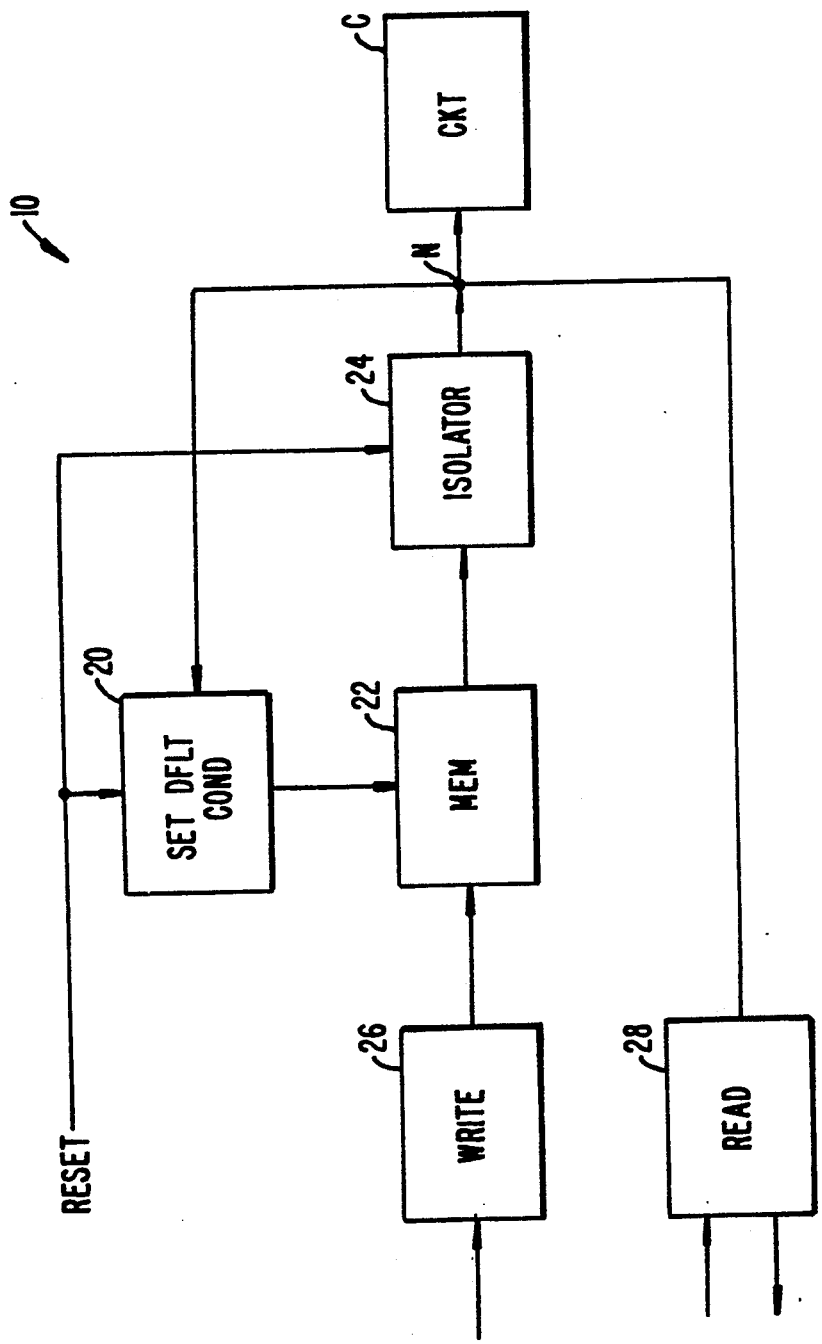
FIG._2.

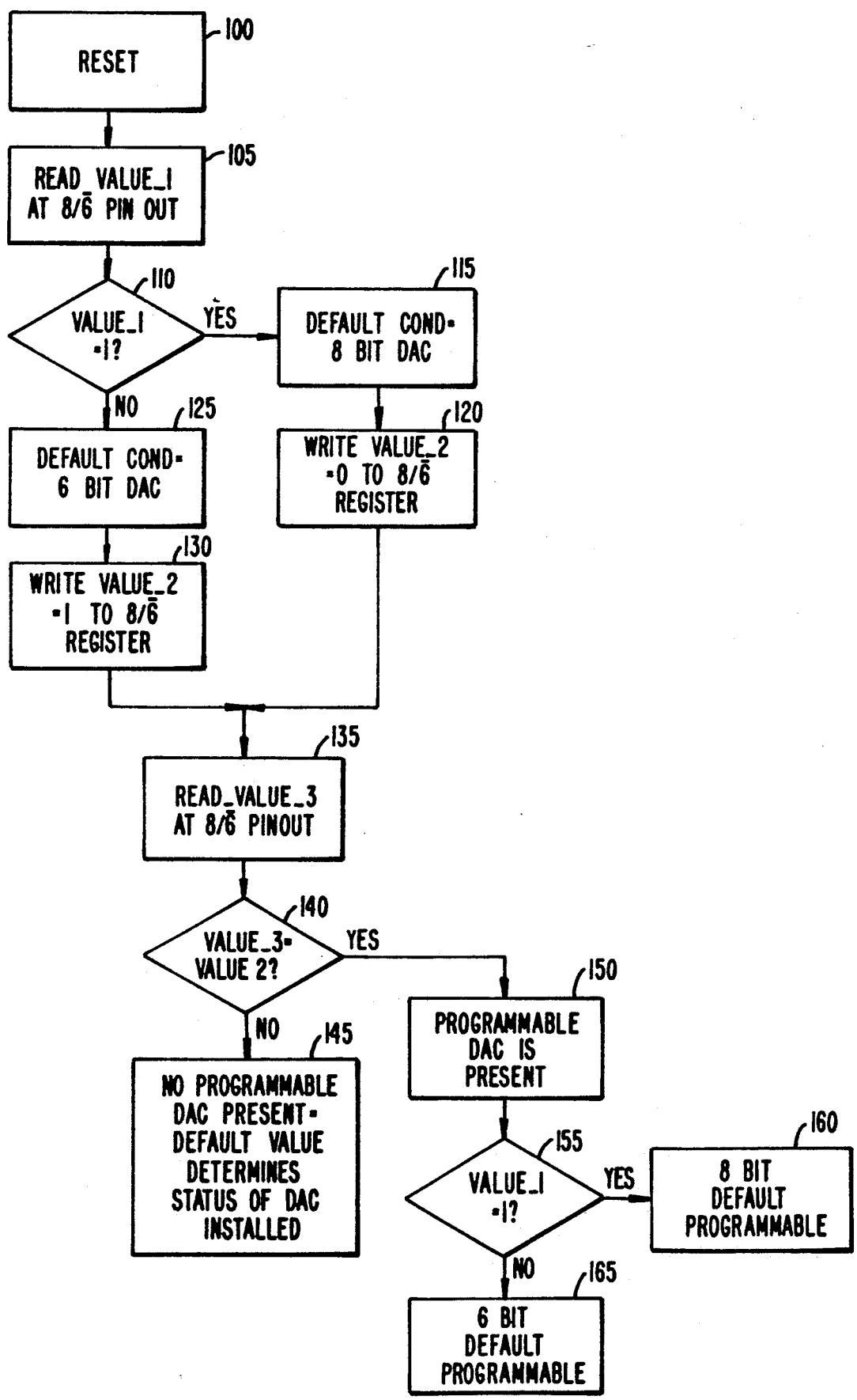
FIG._5.

APPARATUS AND METHOD FOR DECODING FOUR STATES WITH ONE PIN

BACKGROUND OF THE INVENTION

The present invention relates generally to determining the existence of one of a number of conditions on a bidirectional pin. More particularly, the present invention relates to a circuit used in graphics adapter cards to determine which of four types of digital to analog converters are connected thereto by reading logical values at a single pin.

It is known to decode one of two states at a single pin by determining whether the pin level is a logical one or zero. This technique has been fine for graphics adapter cards when only one of two types of digital to analog decoders (DACs) could be used. Prior art devices could use only an 8 bit DAC, only a 6 bit DAC, or provision could be made for either one of these DACs to present. This means that both conditions could be decoded by use of a single pin.

The recent proliferation of computing systems, with their diversity in hardware, have required that hardware manufacturers make provision for adaption of hardware with variable parameters on "as transparent as possible" basis. In other words, a graphics adapter card installed in a system, should be able to detect various attributes of the hardware it is to interface with and configure and operate appropriately. For example, programmable DACs have been developed which operate as an 8 bit DAC or a 6 bit DAC, but have the capability of operating in the alternate mode if selected. Typically, a default logic state is established by external circuitry to operate the DAC in one of the conditions.

As a result, it may become necessary to distinguish among more than two types of hardware. More pins is a solution, but pins are a scarce resource. A user selectable switch having multiple contacts to provide more than two binary conditions represents a solution, but is not transparent to a user who must determine the type of hardware and enter it correctly into the switchbank. Additionally, the user selectable switch approach requires more complex (and expensive) components, and requires additional digital logic to process and store the multiple bits of information from the switches.

SUMMARY OF THE INVENTION

The present invention provides a method and apparatus for decoding which condition among four possibilities is present at a single pin. The invention allows simple and efficient identification of hardware, permitting a circuit to quickly determine the operating parameters of the hardware without intervention by an operator.

According to one aspect of the invention, a novel control circuit is coupled to a pin at a circuit node. The circuit node has a particular default condition of one of two logic states. The control circuit stores the default value and subsequently attempts to drive an alternate logic state onto the pin. The circuit then reads the logic state at the pin to determine if there has been a change of logic state registered. If a change has been registered, then the existence of a third condition or fourth condition is indicated, depending upon the default logic state.

The present invention decodes one of a plurality of conditions present at a circuit node. The decoding apparatus comprises a memory device for driving the circuit node to a selected level. The output of the memory device is selectably coupled to the circuit node by an isolator circuit for isolating the memory from the circuit node in response to a reset signal. A default circuit is coupled to the node and the memory to store a default value to the memory device in response to a reset signal. Thus, upon reset, a default logic state is stored into the memory, which initially drives the node at the default logic state after the isolation period is over.

The logic state present at the circuit node is read after reset and the alternate logic state is then written to the memory. The memory thereafter attempts to drive the circuit node to the alternate logic state. After the attempt is made, the logic state existing at the circuit node is read again. If the logic state is changed, the existence of one of two conditions is established in conjunction with the default logic state.

If unchanged, the existence of one of two other conditions is found in a similar manner.

The hardware of the present invention is able to independently establish which one of two possible default conditions is present. The hardware incorporates an option, which a controller may utilize to obtain a third or fourth condition present at the pin. Thus, one of four conditions may be decoded by the circuit.

A further understanding of the nature and advantages of the invention may be realized by reference to the remaining portions of the specification and the attached drawings.

BRIEF DESCRIPTION OF THE DRAWINGS

FIG. 1 is a block diagram showing the use of a control circuit of the present invention under processor control to establish a particular type of DAC controller present;

FIG. 2 is a block diagram of a preferred embodiment of the control circuit of FIG. 1;

FIGS. 3A–3D are schematic representations of possible terminating networks to add to a pin to set a default logic state for the control circuit of FIG. 2;

FIG. 4 is a circuit schematic of the control circuit of FIG. 2 illustrating one implementation of the hardware coupled to a circuit node at a pin; and FIG. 5 is a flow chart indicating the required control of the control circuit illustrated in FIG. 2.

DESCRIPTION OF THE PREFERRED EMBODIMENT

FIG. 1 is a block diagram showing the use of a control circuit 10 according to the present invention. Control circuit 10 is coupled to a DAC 12. A processor 14 having a memory 16 storing a software program 18, makes it possible to decode which one of a possible four conditions for DAC 12 is present. Table I below depicts four possible conditions which may be present at an 8/6 pin 30 shown in FIG. 4.

TABLE I

| CONDITION | 8/6 PIN BEFORE | 8/6 PIN AFTER | RESISTOR NETWORK |
|---|---|---|---|
| 6 BIT ONLY | 0 | 0 | PD 50 Ω |
| 8 BIT ONLY | 1 | 1 | PU 50 Ω |
| PROG-6* | 0 | 1 | PD 50 KΩ |
| PROG-8# | 1 | 0 | PU 50 KΩ |

PROG = PROGRAMABLE DAC;
*-6 BIT DEFAULT;
-8 BIT DEFAULT
PD = PULL DOWN;
PU = PULL UP

The four conditions are that DAC 12 may be a 6 bit only DAC, an 8 bit only DAC, a programmable DAC having a 6 bit default, or a programmable DAC having an 8 bit default. A programmable DAC is one that may operate in either the 8 bit state, or the 6 bit state, as determined by control circuit 10.

FIG. 2 is a block diagram illustrating the elements of control circuit 10. Control circuit 10 is designed to provide a simple means for determining which one of a plurality of conditions is present at a circuit node N coupled to a circuit C. Circuit node N has associated with it a default logic state which may be established by a preselected voltage or current. It will occur to the reader that the default logic state may be set by many convenient methods.

A default circuit 20 is coupled to node N. Default circuit 20 is also coupled to a memory 22 which is coupled in turn to an isolator 24. Additionally, a write control 26 is coupled to memory 22 and a read control 28 is coupled to circuit node N.

In operation, it will be desired to determine a particular condition for circuit C. Control circuit 10 can determine this condition, and in certain instances, such as when circuit C is a programmable DAC, control circuit 10 can command the condition of circuit C.

Memory 22 is provided to output a specified control signal to circuit C, which is used to decode which condition is present at circuit node N, and alternatively, to command a different condition to circuit C. Therefore, memory 22 must be coupled to circuit node N. However, when setting the default logic state to memory 22, the output of memory 22 must be isolated from circuit node N to prevent the output from influencing the default reading. Thus isolator 24, in response to a reset signal, isolates memory 22 output from circuit node N. The reset signal also causes the default circuit 20 to store the default logic state to memory 22. After the default logic state is stored in memory 22, isolator 24 permits the output of memory 22 to be coupled to circuit node N. Thereafter, memory 22 drives circuit node N at the default logic state.

The default logic state at circuit node N may be read by read circuit 28 anytime after receipt of the reset signal. That is either during the period that memory 22 output is isolated from circuit node N or after the coupling is reestablished.

Read circuit 28 provides the default condition to processor 14 shown in FIG. 1. Processor 14 causes the alternate logic state to be written to memory 22 by write circuit 26. Thereafter, the output of memory 22 attempts to drive circuit node N to the alternate logic state. Depending upon circuit C parameters, memory 22 either will or will not change the logic state at circuit node N to the alternate logic state from the default logic state.

Processor 14 interrogates, via read circuit 28, the current logic state at circuit node N. By use of the default and current logic state information, processor 14 may decode which particular condition, from a plurality of conditions, is present at circuit node N. The reader will appreciate that there are four possible conditions which may be decoded from a single node by use of control circuit 10. These four conditions are: (1) default logic state 1, (2) default logic state 2, (3) alternate logic state 2 having default logic state 1, or (4) alternate logic state 1 having default logic state 2.

However, depending on particular design considerations, it may be sufficient to decode only whether conditions (a) (1) or (2), or (b) (3) or (4); or whether conditions (a) (1), (b) (2), or (c) (3) or (4) are present. That is the number of conditions decoded may be selected from two or three groups of conditions.

Practically, this may be seen in the example outlined in Table I. For certain applications, it may not be necessary to know what the default condition is, so there would be two conditions for DAC 12: fixed operation or programmable operation. Alternatively, it may be necessary to determine the default condition if DAC 12 only had a fixed mode, but if DAC 12 were programmable the information may be irrelevant as either mode may be commanded. Thus, in one sense, only three conditions are decoded. In the preferred embodiment, all four conditions are decoded to establish default conditions for either fixed or programmable modes of operation. Therefore, describing the particular number of conditions decoded is not to serve as a specific limitation, but only as a description of the preferred embodiment.

The default conditions may be established by a select resistor network 32 which must be added to $8/\overline{6}$ pin 30. FIGS. 3A-3D indicate specific resistor networks, 32A-32D respectively, which may be used with control circuit 10 to set appropriate default logic states. This represents only one of many possible ways to implement the desired result, and alternative embodiments are possible given any particular set of design characteristics.

FIG. 4 is a circuit schematic of control circuit 10. FIG. 5 is a flow chart indicating the required control of the control circuit illustrated in FIG. 2. A flip-flop 40 has an output terminal 42 coupled to $8/\overline{6}$ pin 30. Flip-flop 40 is optionally referred to as an $8/\overline{6}$ register. Flip-flop 40 also has a data input terminal 44, a clock input 46, and preset and clear input terminals 48 and 50 respectively. Coupling of output terminal 42 to $8/\overline{6}$ pin 30 is performed through a tri-state driver 52 having an enable terminal 54.

A reset terminal 60 is provided for receipt of a reset signal from the processor 14 to initialize control circuit 10. Means for presetting or clearing flip-flop 40 is provided by NAND gates 62 and 64. Respective first inputs of NAND gates 62 and 64 are coupled to reset terminal 60. Respective second inputs of NAND gates 62 and 64 are coupled to $8/\overline{6}$ pin 30. The second input of NAND gate 64 is coupled through an invertor 70. Enable terminal 54 of tri-state driver 52 is coupled to reset terminal 60 through a delay circuit 72. The delay of delay circuit 72 is chosen based on the hold time of the circuit.

Writing of flip-flop 40 is controlled by a first AND gate 80. AND gate 80 has an output 82 which is coupled to clock input terminal 46. A first input 84 of AND gate 80 is coupled to a write terminal 86 for receipt of a write signal. A second input 88 of AND gate 80 is coupled to a register select terminal 90 for receipt of a register select signal.

Reading of any particular logic state present at $8/\overline{6}$ pin 30 is accomplished by a second AND gate 92. AND gate 92 has a first input 94 coupled to register select terminal 90. A second input 96 of AND gate 92 is coupled to a read terminal 98 for receipt of a read signal.

A driver 100 has an input 102 coupled to $8/\overline{6}$ pin 30 and an enable terminal 104 coupled to an output 106 of second AND gate 92.

Operation of control circuit 10 will first be described with reference to FIGS. 1, 3A, and 4. Resistor network 32A will be assumed to be coupled between control circuit 10 and DAC 12 of FIG. 1 in place of resistor network 32. Resistor network 32A has a resistor R coupling a line to $V_{cc}$, the line extending between 8/6 pin 30 and DAC 12.

A reset signal is caused to be issued from processor 14 to reset terminal 60. The reset signal causes tri-state driver 52 to isolate 8/6 pin 30 from the output of flip-flop 40. This means that a default logic state of logical "1", as supplied by resistor network 32A, exists initially at 8/6 pin 30 right after reset. NAND gates 62 and 64 cause flip-flop 40 to be preset to a logical "1" because a logical "1" is present at 8/6 pin 30. Had the logical value at 8/6 pin 30 been a "0", then flip-flop 40 would have been cleared by NAND gates 62 and 64.

After the default logic state of logical "1" is latched into flip-flop 40, the delay time of delay circuit 72 lapses, and tri-state driver 52 permits the output from data output 42 to appear at 8/6 pin 30. Processor 14 then causes a register select signal and a read signal to appear at terminals 90 and 98 respectively. These signals permit driver 100 to pass the logical "1" back to processor 14 to determine that DAC 12 has an 8 bit default mode of operation. It then becomes necessary to interrogate the control circuit 10 to determine if DAC 12 coupled to 8/6 pin 30 is programmable or not, that is, if DAC 12 may be operated in 6 bit mode of operation.

To interrogate control circuit 10, processor 14 causes a write signal and a register select signal to be appear at input terminals 86 and 90 respectively. Additionally, a logical "0", indicative of a 6 bit DAC, is caused to appear at data input terminal 44. These signals cause the alternative logic state to the default logic state to be latched into flip-flop 40. If a logical "0" had been stored at reset, the alternate logic state of logical "1" would have been written to flip-flop 40.

As a result, a logical "0" appears at 8/6 pin 30, and is coupled to an 8/6 pin of DAC 12. Processor 14 again initiates a read operation to determine the value present at 8/6 pin 30. In the particular example, a logical "0" will be read at 8/6 pin 30, indicating that the alternate logic state has successfully been written to DAC 12. The simple fact that the alternate logic state has been written to DAC 12 indicates that it is a programmable DAC, and that it has an 8 bit default mode of operation. The success of this method depends upon the realization that it is the value at 8/6 pin 30 which is read, and not the value output from flip-flop 40.

This can be appreciated by observing the results had resistor network 32B been substituted for resistor network 32A in the previous description. The preceding steps would have been the same until it came time to read whether the alternate logical "0" which had been written to 8/6 pin 30 was present at 8/6 pin 30. The logical "0" output from flip-flop 40 would have no effect on the logical "1" value which network 32B would hold 8/6 pin 30 to. Therefore, upon reading the value at 8/6 pin 30, a logical "1" would be read, instead of the logical "0" written to flip-flop 40. Processor 14 would then know that DAC 12 coupled to control circuit 10 is an 8 bit only DAC, and not a programmable DAC as in the previous example.

Therefore, the importance of reading the value present at 8/6 pin 30, and not the value stored in flip-flop 40, is seen. If the value stored in flip-flop 40 were read, then in every instance the system would determine that a programmable DAC was present because by definition, the alternate logic state to any given default logic state is always written to the flip-flop 40 after determining the default logic state of DAC 12 coupled to control circuit 10.

In similar fashion, control circuit 10 may be used to decode whether a DAC 12 coupled through a resistor network 32 showing a default logic state of 6 bit operation is programmable or not.

Thus, control circuit 10 may be effectively used to decode which of the four conditions outlined in table I is present. Table I shows each condition, with corresponding logic levels present at 8/6 pin 30 before and after an attempt to write has been made, and a value of resistor R which may be used to implement the above described embodiment.

FIG. 5 is a flow chart indicating control of the control circuit illustrated in FIG. 2. The preferred embodiment includes a DAC 12 coupled to the node 30 through a resistor network 32. A reset signal, step 100, is issued to the SET DFLT COND 20 and to the ISOLATOR 24. In a preferred embodiment, VALUE_1 present at the node 30 is read, step 105. Step 110 tests VALUE_1 to determine the default condition. If VALUE_1=1, then step 115 establishes the default condition as an 8 bit DAC. See Table I. Step 120 thereafter tries to write VALUE_2=0 to the node 30. If the test at step 110 fails, then step 125 established the default condition as a 6 bit DAC. Step 130 thereafter tries to write VALUE_2=1 to the node 30. The paths from steps 120 and 130 converge at step 135 which reads VALUE_3 now present at the node 30. Step 140 tests whether VALUE_3=VALUE_2. If the VALUE_3 read from the node does not equal VALUE_2, then the DAC coupled to the node is not a programmable DAC, wherein the DEFAULT CONDITION estabilishes the particular DAC type, step 145. VALUE_3=-VALUE_2, at step 150, establishes that a programmable DAC is coupled to the node 30. Step 155 tests the VALUE_1 (default condition). If VALUE_1=1, step 160, then the DAC type is an 8 bit default, programmable DAC. Step 165 established that the DAC type is a 6 bit default, programmable DAC.

While the above provides a full and complete description of a preferred embodiment of the present invention, various changes and modifications may occur to those of ordinary skill in the art, given the benefit of the present disclosure. Therefore, it is the appended claims which define the scope of the present invention, which is not to be construed to be limited to the specific embodiment set out herein.

What is claimed is:

1. Apparatus for decoding one of a plurality of conditions present at a circuit node having a default logic state, comprising:
   a memory, having an output coupled to the circuit node, for storing the default logic state and a commanded logic state;
   an isolator circuit, coupled to said memory, for isolating said memory output from said circuit node, in response to a reset signal;
   a default circuit, coupled to said circuit node and said memory and responsive to said reset signal, for storing said default logic state in said memory while said memory output is isolated from said circuit node;
   a read circuit, coupled to said circuit node, for reading a particular logic state present at said circuit node; and a write circuit, coupled to said memory, to cause said commanded logic state to be output from said memory output to said circuit node.

2. The decoding apparatus of claim 1, wherein said memory is a flip-flip.

3. The decoding apparatus of claim 2, further comprising:
said flip-flop having a preset terminal and a clear terminal; and
a first NAND gate having a first input coupled to said circuit node, an output coupled to said present terminal of said flip-flop, and a second input for receipt of said reset signal;
a second NAND gate having a first input coupled to said circuit node through an INVERTER, an output terminal coupled to said clear terminal of said flip-flop, and a second input terminal coupled to said second input terminal of said first NAND gate.

4. The decoding apparatus of claim 2, wherein said isolator circuit further comprises:
a delay circuit, having an input terminal and an output terminal, said input terminal of said delay circuit for receipt of said reset signal; and
a tri-state driver having an input coupled to said memory output, an output coupled to said circuit node, and an enable input coupled to said output terminal of said delay circuit.

5. The decoding apparatus of claim 3, wherein said isolator circuit further comprises:
a delay circuit, having an input terminal and an output terminal, said input terminal of said delay circuit for receipt of said reset signal; and
a tri-state driver having an input coupled to said memory output, an output coupled to said circuit node, and an enable input coupled to said output terminal of said delay circuit.

6. Apparatus for decoding one of a plurality of conditions present at a circuit node having a default logic state, comprising:
a memory having a data input terminal, a data output terminal coupled to the circuit node, means for presetting said memory, and means for setting said memory;
means, responsive to a reset signal and coupled to said circuit node and said data output terminal, for isolating said output terminal of said memory from said circuit node;
means, responsive to said reset signal and coupled to said memory presetting and setting means, for causing the default logic state to be stored in said memory when said circuit node is isolated from said memory output terminal, said default logic state corresponding to said first condition or said second condition;
means, coupled to said circuit node and responsive to a read signal, for determining said first condition present at said circuit node;
means, coupled to said memory, for causing to be written to said memory, a second logic state, said second logic state different from said default logic state; and
means for determining if said first default logic state has changed to said second logic state at said circuit node, if so, said change corresponding to a third condition or fourth condition of said circuit node.

7. Apparatus for decoding one of four conditions present at a circuit node having a default logic state corresponding to one of a first condition or a second condition, comprising:
a memory having a data input terminal, and a data output terminal controllably coupled to the circuit node and selectively isolated from said circuit node in response to a reset signal;
first and second NAND gates, having first inputs coupled to each other for receipt of said reset signal and second inputs coupled to said circuit node, said second input of said second NAND gate having an inverter, said first and second NAND gates coupled to said memory to initially store said default logic state in said memory in response to said reset signal;
a selectively controllable driver coupled to said circuit node for transferring an initial logic state at said circuit node to a control means in response to a read signal, said driver initially transferring said default logic state after receipt of a reset signal and subsequently transferring a subsequent logic state;
said control means, coupled to said memory and to said driver, and responsive to said initial logic state, for determining whether said default logic state is said first or said second condition, and to write a desired logic state to said memory to provide an alternate logic state to said circuit node; and
said control means further causing said driver to transfer said subsequent logic state at said circuit node, said control means establishing whether said subsequent logic state corresponding to said initial logic state, it being indicative of third and fourth conditions if said initial logic state has changed to said subsequent logic state, said third condition indicated by said initial logic state being said first condition, and said fourth condition indicated by said initial logic state being said second condition.

8. A process for decoding one of four conditions present at a circuit node, the circuit node having a default logic state either as first of second conditions, comprising the steps of:
providing a memory to store a logic state representative of a condition and to output said logic state to the circuit node;
isolating said memory from said circuit node for a preselected period in response to a reset signal;
storing the default logic state in said memory while said memory is isolated;
reading said default logic state as an initial logic state at said circuit node;
determining whether said initial logic state is the first or the second condition;
writing an alternate logic state to said memory and said circuit node;
interrogating said circuit node to read a subsequent logic state present at said circuit node; and
establishing whether said read subsequent logic state is said initial logic state or said alternate logic state, one of third and fourth conditions being present if the alternate logic state is present and one of said first and second conditions being indicated if said subsequent logic state is the same as said initial logic state, differentiation between said first and second conditions or said third and fourth conditions being dependent upon said default logic state.

9. A process for decoding one of four conditions present at a circuit node, the circuit node having a default logic state, the process comprising the steps of:
  storing an initial logic state corresponding to the default logic state present at the circuit node to a memory having an output coupled to said circuit node;
  reading said initial logic state;
  writing an alternate logic state to said circuit node by causing said memory to output said alternate logic state;
  reading a subsequent logic state and from said circuit node; and
  comparing said subsequent logic state to said initial logic state to determine if a changed logic state is present.

10. Apparatus for decoding one of four conditions of a DAC coupled to a graphics system by use of a control circuit, comprising:
  an 8/$\overline{6}$ pin out;
  an 8/$\overline{6}$ register having a data input terminal, a clock input terminal, a preset input terminal, a clear input terminal, and a data output terminal
  a tri-state driver having an input terminal coupled to said output terminal of said 8/$\overline{6}$ register, an output terminal coupled to said 8/$\overline{6}$ pin out, and an enable input terminal;
  a first NAND gate having a first input coupled to said 8/6 pin out, an output coupled to said preset terminal of said 8/6 register, and a second input;
  a second NAND gate having a first input coupled to said 8/6 pin out through an INVERTER, an output terminal coupled to said clear terminal of said 8/6 register, and a second input terminal coupled to said second input terminal of said first NAND gate and to said enable terminal of said tri-state driver through a delay circuit;
  a reset terminal coupled to said second input terminal of said first NAND gate;
  a first AND gate having a first input coupled to a write terminal, an output terminal coupled to said clock input terminal of said 8/6 register, and a second input coupled to a register select terminal;
  a second AND gate having a first input coupled to a read terminal, a second input coupled to said register select terminal, and an output; and
  an output driver having an input coupled to said 8/6 pin out and an enable terminal coupled to said output of said second AND gate.

* * * * *

UNITED STATES PATENT AND TRADEMARK OFFICE
CERTIFICATE OF CORRECTION

PATENT NO. : 5,023,483

DATED : June 11, 1991

INVENTOR(S) : Bradley A. May

It is certified that error appears in the above-identified patent and that said Letters Patent is hereby corrected as shown below:

TITLE PAGE: In item [56], first line of column 2, change "4,910,417 5/1990 El Ganal et al." to --4,910,417 3/1990 El Gamal et al.--.

In column 1, line 19, delete "to present" and substitute therefor, --to be present--.

In column 1, line 49, delete "amoung" and substitute therefor, --among--.

In column 2, Table I, third and fourth lines under "RESISTOR NETWORK", delete "PD 50 KΩ" and substitute therefor, --PD 50 kΩ--.

In column 4, lines 31 and 32, delete "FIG. 5 is a flow chart indicating the required control of the control circuit illustrated in FIG. 2."

In column 5, line 28, delete "to be appear" and substitute therefor, --to appear--.

In column 6, lines 26 and 40, delete "established" and substitute therefor, --establishes--.

In column 6, line 35, delete "3=-" and substitute therefor, --3=--.

In column 7, line 5, delete "flip-flip" and substitute therefor, --flip-flop--.

UNITED STATES PATENT AND TRADEMARK OFFICE
CERTIFICATE OF CORRECTION

PATENT NO. : 5,023,483

DATED : June 11, 1991

INVENTOR(S) : Bradley A. May

It is certified that error appears in the above-identified patent and that said Letters Patent is hereby corrected as shown below:

In column 7, between lines 9 and 10 insert, --said default circuit comprising:--.

In column 7, bridging lines 11 and 12, delete "present" and substitute therefor, --preset--.

In column 8, line 33, delete "corresponding" and substitute therefor, --corresponds--.

In column 8, line 42, delete "first of second" and substitute therefor, --first or second--.

In column 9, line 12, delete "state and from" and substitute therefor, --state from--.

In column 9, line 20, delete "$8\overline{6}$" and substitute therefor, --$8/\overline{6}$--.

UNITED STATES PATENT AND TRADEMARK OFFICE
CERTIFICATE OF CORRECTION

PATENT NO. : 5,023,483

DATED : June 11, 1991

INVENTOR(S) : Bradley A. May

It is certified that error appears in the above-identified patent and that said Letters Patent is hereby corrected as shown below:

In column 9, line 23, delete "output terminal" and substitute therefor, --output terminal;--.

In column 10, lines 4, 5, 7, 9, 17 and 22, delete "8/6" and substitute therefor, --8/$\overline{6}$--.

Signed and Sealed this

Ninth Day of February, 1993

*Attest:*

STEPHEN G. KUNIN

*Attesting Officer*     *Acting Commissioner of Patents and Trademarks*